(12) United States Patent
Lien et al.

(10) Patent No.: US 11,314,588 B2
(45) Date of Patent: Apr. 26, 2022

(54) MEMORY DEVICE AND MULTI PHYSICAL CELLS ERROR CORRECTION METHOD THEREOF

(71) Applicant: Winbond Electronics Corp., Taichung (TW)

(72) Inventors: Chuen-Der Lien, San Jose, CA (US);
Ming-Huei Shieh, San Jose, CA (US);
Chi-Shun Lin, San Jose, CA (US);
Seow Fong Lim, San Jose, CA (US);
Ngatik Cheung, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/679,292

(22) Filed: Nov. 11, 2019

(65) Prior Publication Data

US 2021/0141689 A1 May 13, 2021

(51) Int. Cl.
*G06F 11/10* (2006.01)

(52) U.S. Cl.
CPC ...... *G06F 11/1044* (2013.01); *G06F 11/1056* (2013.01); *G06F 11/1076* (2013.01); *G11C 2211/4062* (2013.01)

(58) Field of Classification Search
None
See application file for complete search history.

(56) References Cited

U.S. PATENT DOCUMENTS

| | | | | |
|---|---|---|---|---|
| 4,204,634 A * | 5/1980 | Barsuhn | ............... | G06F 11/1056 714/763 |
| 5,878,048 A * | 3/1999 | Ishiguro | ................. | G11C 17/14 714/710 |
| 9,286,161 B2 | 3/2016 | Pawlowski | | |
| 10,108,509 B2 * | 10/2018 | Qidwai | ............... | G06F 11/1048 |
| 2002/0126551 A1 * | 9/2002 | Koshita | ................ | G11C 29/816 365/200 |
| 2007/0103977 A1 * | 5/2007 | Conley | .................. | G11C 29/81 365/185.09 |
| 2007/0103978 A1 * | 5/2007 | Conley | ............. | G11C 16/0483 365/185.09 |
| 2008/0229161 A1 * | 9/2008 | Lee | ......................... | H01L 22/22 714/710 |
| 2012/0284586 A1 * | 11/2012 | Wang | ................. | G06F 11/1048 714/763 |
| 2017/0025184 A1 * | 1/2017 | Park | .................... | G11C 16/0483 |

FOREIGN PATENT DOCUMENTS

| | | |
|---|---|---|
| CN | 102768861 | 11/2012 |
| TW | I354992 | 12/2011 |

* cited by examiner

*Primary Examiner* — April Y Blair
*Assistant Examiner* — Matthew W Wahlin
(74) *Attorney, Agent, or Firm* — JCIPRNET

(57) ABSTRACT

A memory device and a multiple cells error correction in a memory cell is provided. The memory device includes a plurality of memory cells and a memory control circuit. Each of the memory cells includes a first type physical cell and a second type physical cell. The memory control circuit is coupled to each of the memory cells. The memory control circuit writes a writing data into the first type physical cell and verifies the data stored in the first type physical cell is same as the writing data or not. The writing data is set and processed by performing a write operation. The memory control circuit writes the writing data into the second type physical cell when the data stored in the first type physical cell is not same as the writing data.

16 Claims, 3 Drawing Sheets

MEMORY DEVICE AND MULTI PHYSICAL CELLS ERROR CORRECTION METHOD THEREOF

BACKGROUND OF THE INVENTION

Field of the Invention

The invention relates to a memory device and an operating method thereof, and particularly relates to a memory device and a method for multiple physical cells error correction in the memory device.

Description of Related Art

In a usage of memory device, a multiple non-volatile memories (NVM) with different type memories which are integrated in a single chip, and the NVM respectively have different data retention and different cycling endurances in ECC message bits and ECC parity bits. For integrating the memories, a suitable ECC method is necessary for enhancing data reliability.

SUMMARY OF THE INVENTION

The disclosure is directed to multiple cells error correction method in a memory device and the memory device integrates a plurality of memory cells with different types of physical cells and a memory control circuit.

The disclosure provides the memory device includes a plurality of memory cells and a memory control circuit. Each of the memory cells includes a first type physical cell and a second type physical cell. The memory control circuit is coupled to each of the memory cells. The memory control circuit writes a writing data into the first type physical cell and verifies the data stored in the first type physical cell is same as the writing data or not. The writing data is set and processed by performing a write operation. The memory control circuit writes the writing data into the second type physical cell when the data stored in the first type physical cell is not same as the writing data.

The disclosure provides a method for a multiple cells error correction in a memory cell. The method comprising the steps of: performing a write operation by writing a writing data into a first type physical cell, verifying the data stored in the first type physical cell is same as the writing data or not, re-performing the write operation by writing the writing data into a second type physical cell when the data stored in the first type physical cell is not same as the writing data.

According to the above descriptions, the present disclosure provides the method for error correction on the first type physical cell by verifying the data stored in the first type physical cell is same as the writing data or not and re-performing the write operation by writing the writing data into a second type physical cell when the data stored in the first type physical cells is not same as the writing data, thus the multiple physical cells error correction in a memory cell is achieved. The multiple cells error correction method may apply to the memory device having different data retention and cycling endurance in the message bit and also to the memory device having different data retention and cycling endurance in the parity bit. Thus, a cycling rate of the memory device may be improved accordingly.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
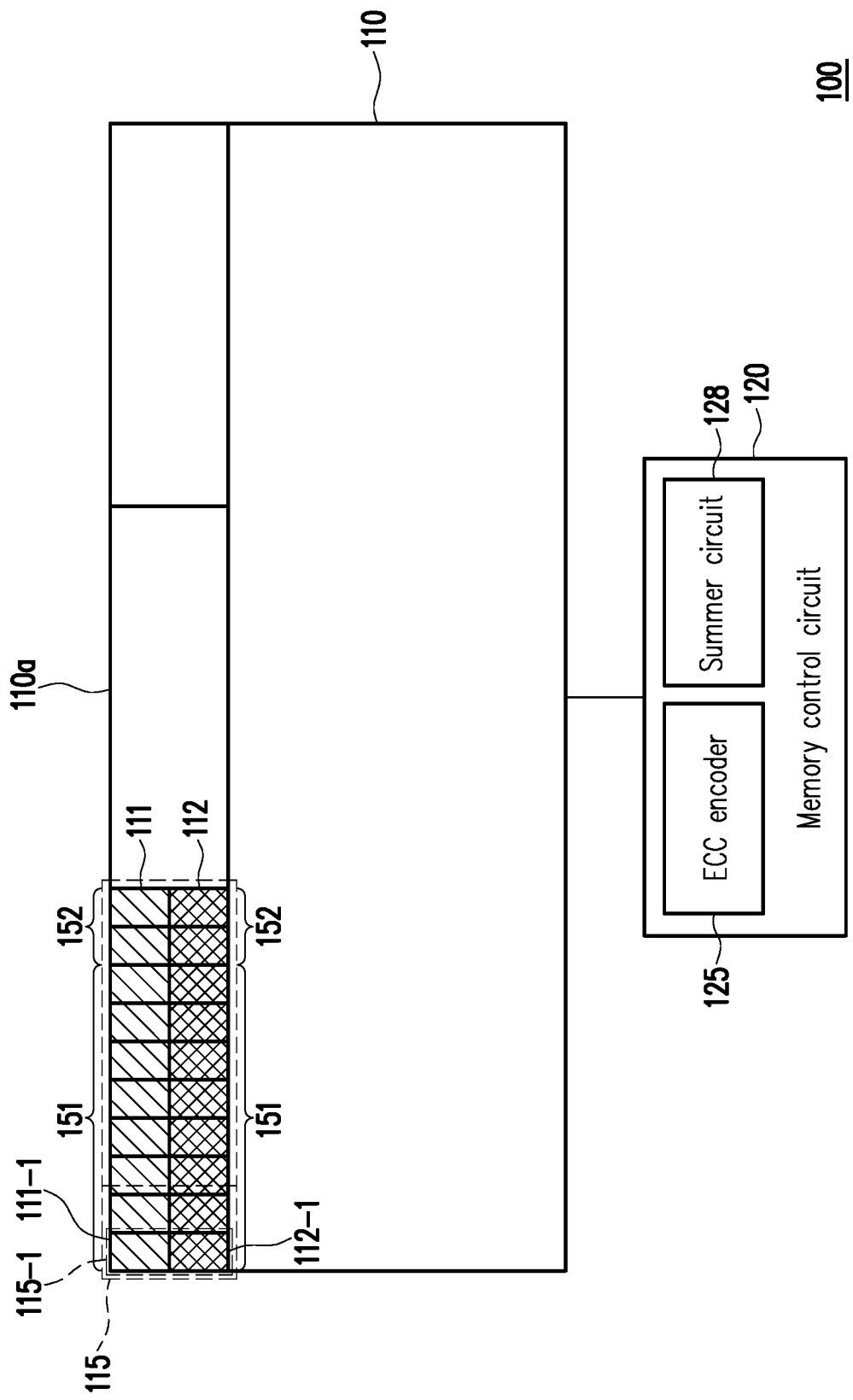
FIG. 1 illustrates a memory device according to another embodiment of the disclosure.

Referring to FIG. 1, which illustrates a memory device according to an embodiment of the present disclosure. In this embodiment, the memory device 100 includes a memory cell array 110 and a memory control circuit 120. The memory cell array 110 includes a plurality of word lines, each of the word lines includes a plurality of data/code words 110*a*. Each of the data/code words 110*a* includes a plurality of memory cells 115. The memory cell array 110 and the memory control circuit 120 may be integrated to a signal chip. The memory device 100 is a volatile memory device and/or a non-volatile memory device.

With reference to FIG. 1, in some embodiments, the memory cells 115 is 10-bit. Each of the plurality of memory cells 115-1 includes a first type memory cell 111-1 and a second type memory cell 112-1. The memory cells 115 includes a plurality of message bits, which is also defined as a message bit data 151 and a plurality of parity bits, also defined as a parity bit data 152. The number of bits in the message bit data 151 is 8-bit and the number of bits in the parity bit data 152 is 2-bit.

In some embodiments, the memory cells 115 may be 16-bit, 64-bit, and so on, thus the number of bits in the memory cells 115 is not limited in this disclosure.

Each of the memory cells 115 includes a first type physical cell 111 and a second type physical cell 112. The first type physical cell 111 and the second type physical cell 112 are all the volatile memory cells and/or the non-volatile memory cells respectively has different cycling rates. For example, the first type physical cell 111 and the second type physical cell 112 may be an one-time programming (OTP) memory cells, a flash memory cell array or an electrically-erasable programmable read-only memory (EEPROM) memory cell array. An OTP memory cell may have one writing cycle, a flash memory cell may have 100k writing cycles, and an EEPROM memory cell may have 1k writing cycles.

The first type physical cell 111 is also defined as used physical cell.

The second type physical cell 112 is defined as unused physical cell, which are not used but used for a data repairing or used for backup the data.

The first type physical cell 111 and the second type physical cell 112 are sub-divided into a message bit data 151 and a parity bit data 152.

In some embodiments, the second type physical cell 112 is written to a same voltage level or a resistance value corresponding to a pre-set value. In other words, the second type physical cell 112 is initially written as pre-set value such as checker board pattern.

In some embodiments, the second type physical cell 112 is written to a same voltage level or a resistance value corresponding to bit "1". In other words, the second type physical cell 112 is initially written as bit "1".

In some embodiments, the second type physical cell 112 is written to a same voltage level or a resistance value corresponding to bit "0". In other words, the second type physical cell 112 is initially written as bit "0".

The memory control circuit 120 includes an error correction code (ECC) encoder 125 and a summer circuit 128. The memory control circuit 120 is coupled to each of the memory cells 110.

The ECC encoder 125 is configured to perform an error correction operation on the memory cells 110. When the memory device is initialized, the memory control circuit 120 writes a writing data into the first type physical cell 111. The writing data is set and processed by performing a write operation.

In some embodiments, the writing data is set and processed by an external device. The external device may be a controller or another memory device, thus the type of the external device is not limited in this disclosure.

In some embodiments, the writing data of the first type physical cell 111 is a message bit data. In some embodiments, the writing data of the first type physical cell 111 is a parity bit data.

After the writing data is written into the first type physical cell 111, if the first type physical cell 111 is a failed memory cell, the data of the first type physical cell 111 may not be same as the writing data which is written by the memory control circuit 120. Therefore, the data of the first type physical cell 111 is verified by the summer circuit 128 to determine the data stored in the first type physical cell 111 is same as the writing data or not. In detail, the summer circuit 128 is configured to perform a verification operation in the first type physical cell 111 by verifying a cell current sum of the first type physical cell 111 and the second type physical cell 112. If the verification of the data stored in the first type physical cell 111 is not same as the writing data, then the memory control circuit 120 writes the writing data into the second type physical cell 112.

The summer circuit 128 may be implemented with logic circuits with the combination of logic gates (e.g., AND, OR, NOT, EXOR, EXNOR, Flip flops, etc.), thus the type of summer circuit 128 used in the disclosure is not limited thereto.

In some embodiments, the ECC encoder 125 is configured to perform the error correction operation on the message bit data in the first type physical cell 111.

In some embodiments, the ECC encoder 125 performs the error correction operation on the parity bit data in the first type physical cell 111, thus the error correction operation performed by the ECC encoder 125 in the memory device 100 is not limited in this disclosure.

In some embodiments, the memory control circuit 120 may perform the multiple physical cells error correction method may combine the error correction operation on the message bit data and the parity bit data in the memory cells.

It is noted that the number of bits in the message bit data 151 is greater than the number of bits in the parity bit data 152 in the first type physical cells 111. The parity bits may correct more number of bits than the message bits in the first type physical cell 111. Thus, the message bit data 151 uses different number of physical cells from the parity bit data 152. By using multiple physical cells error correction method, the data retention and the cycling endurance requirement of the message bit data are different from the parity bit data, thus the data reliability is improved.

Figure 2:
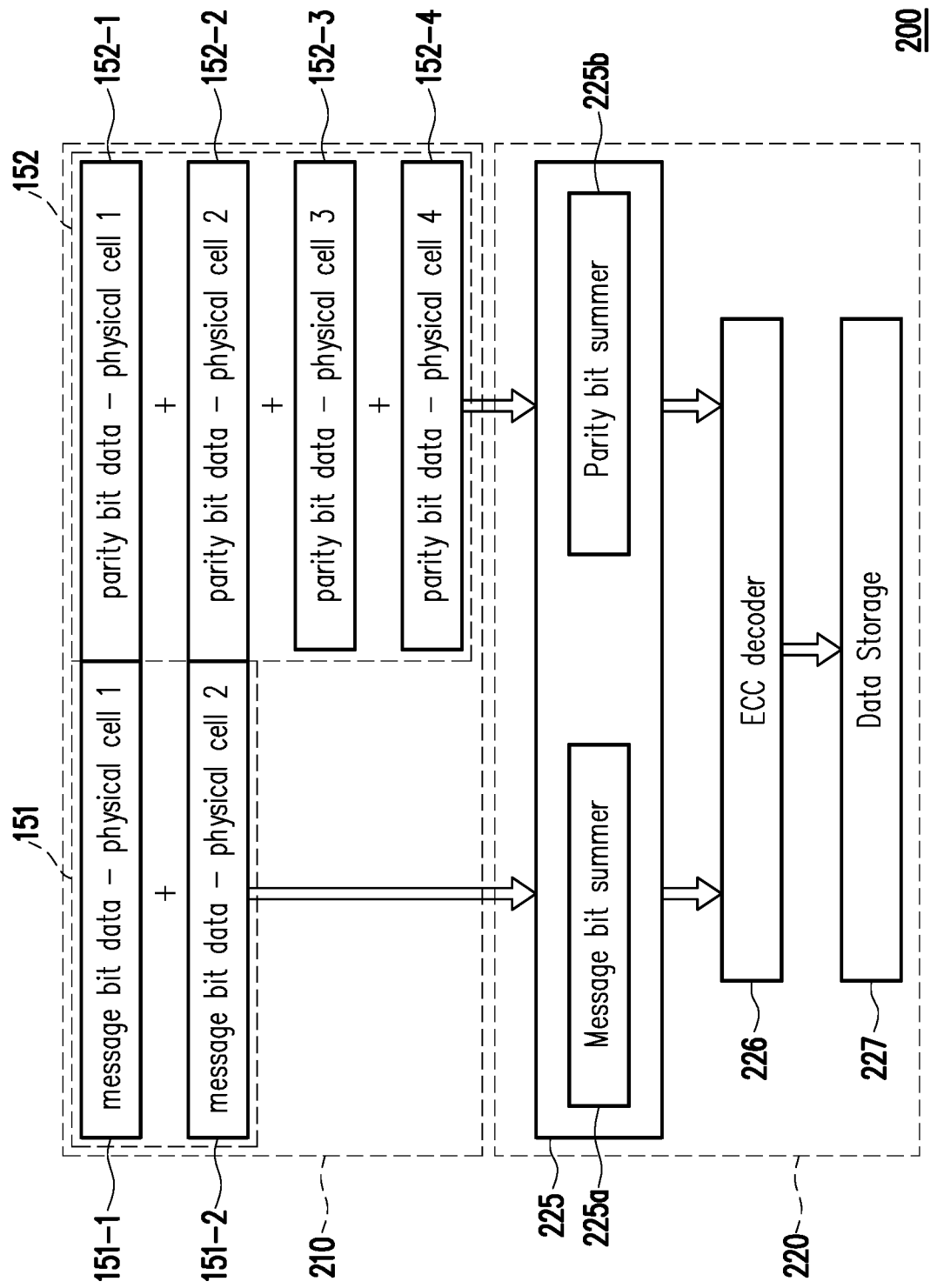
FIG. 2 illustrates a memory device according to an embodiment of the disclosure.

Referring to FIG. 2, which illustrates a memory device according to an embodiment of the disclosure. The memory device 200 includes a plurality of data/code words 210 and a memory control circuit 220.

With reference to FIG. 1, each of the data/code words 210 includes a plurality of memory cells, which includes a first type physical cell and a second type physical cell.

The data/code words 210 and the memory control circuit 220 are respectively similar to the data/code words 110*a* and a memory control circuit 120 with reference to FIG. 1 and FIG. 2, thus the detail description of the data/code words 210 and the memory control circuit 220 are omitted herein.

The data/code words 210 includes a plurality of memory cells, the plurality of memory cells includes a message bit data 151 and a parity bit data 152. In this embodiment, the message bit data 151 includes a message bit data—physical cell 1 151-1 and a message bit data—physical cell 2 151-2. Similarly, the parity bit data 152 includes a parity bit data—physical cell 1 152-1, a parity bit data—physical cell 2 152-2, a parity bit data—physical cell 3 152-3, and a parity bit data—physical cell 4 152-4. In some embodiments, the parity bit data 152 use more number of physical cells than that of message bit data 151.

The memory control circuit 220 includes a summer circuit 225, an ECC decoder 226 and a data storage 227.

The summer circuit 225 includes a message bit summer 225*a* and a parity bit summer 225*b*. It is noted that the summer circuit 225 is same as the summer circuit 128 with reference to FIG. 1. The summer circuit 225 is configured to perform a current sum verification to verify the data stored in the first type physical cell 111 is same as the writing data or not.

With reference to FIG. 1, the ECC encoder 125 of the memory control circuit 120 performs an error correction operation ECC on the first type physical cell 111, and the memory control circuit 220 writes the message bit data 151 into the first type physical cell 111. After the message bit data 151 is written into the first type physical cell 111, if the first type physical cell 111 is a failed memory cell, the data of the first type physical cell 111 may not be same as the message bit data 151 which is written by the memory control circuit 220. Therefore, the data of the first type physical cell 111 is verified by the message bit summer 225*a* to determine the data stored in the first type physical cell 111 is same as the message bit data 151 or not. In detail, the message bit summer 225*a* is configured to perform a verification operation in the first type physical cell 111 by verifying a cell current sum of the first type physical cell 111 and the second type physical cell 112. If the verification of the data stored in the first type physical cell 111 is not same as the message bit data 151, the memory control circuit 220 writes the message bit data 151 into a second type physical cell 112. After the verification operation, the ECC decoder 226 decodes the message bit data 151 from the data/code words 210 and the memory control circuit 220 stores the data in the data storage 227.

Similarly, with reference to FIG. 1, an error correction operation ECC is performed on the first type physical cell 111, and the memory control circuit 220 writes the parity bit data 152 into the first type physical cell 111. After the parity bit data 152 is written into the first type physical cell 111, if the first type physical cell 111 is the failed memory cell, the data of the first type physical cell 111 may not be same as the parity bit data 152 which is written by the memory control circuit 220. Therefore, the data of the first type physical cell 111 is verified by the parity bit summer 225b to determine the data stored in the first type physical cell 111 is same as the parity bit data 152 or not. In other words, the parity bit summer 225b is configured to perform the verification operation in the first type physical cell 111 by verifying the cell current sum of the first type physical cell 111 and the second type physical cell 112. If the verification of the data stored in the first type physical cell 111 is not same as the parity bit data 152, the memory control circuit 220 writes the parity bit data 152 into the second type physical cell 112. After the verification operation, the ECC decoder 226 decodes the parity bit data 152 from the data/code words 210 and the memory control circuit 220 stores the data in the data storage 227.

It is noted that, the memory control circuit 220 writes the message bit data 151 and the parity bit data 152 in the first type physical cell 111 is performed parallel or step by step operation, thus the error correction operation ECC on the first type physical cell 111 is not limited in this disclosure.

The message bit summer 225a and parity bit summer 225b are performing the same function to read out the summing cell current of multiple physical cell(s) from the message bit data 151 and the parity bit data 152, since the parity bit data 152 may have more cycling time than message bit data 151 when a write data width is less than the message bit data 151 width, the parity bit data 152 may use more physical cells than message bit data 151.

By using multiple physical cells error correction method, the data retention and the cycling endurance requirement of the message bit data are different from the parity bit data, thus the data reliability is improved.

Figure 3:
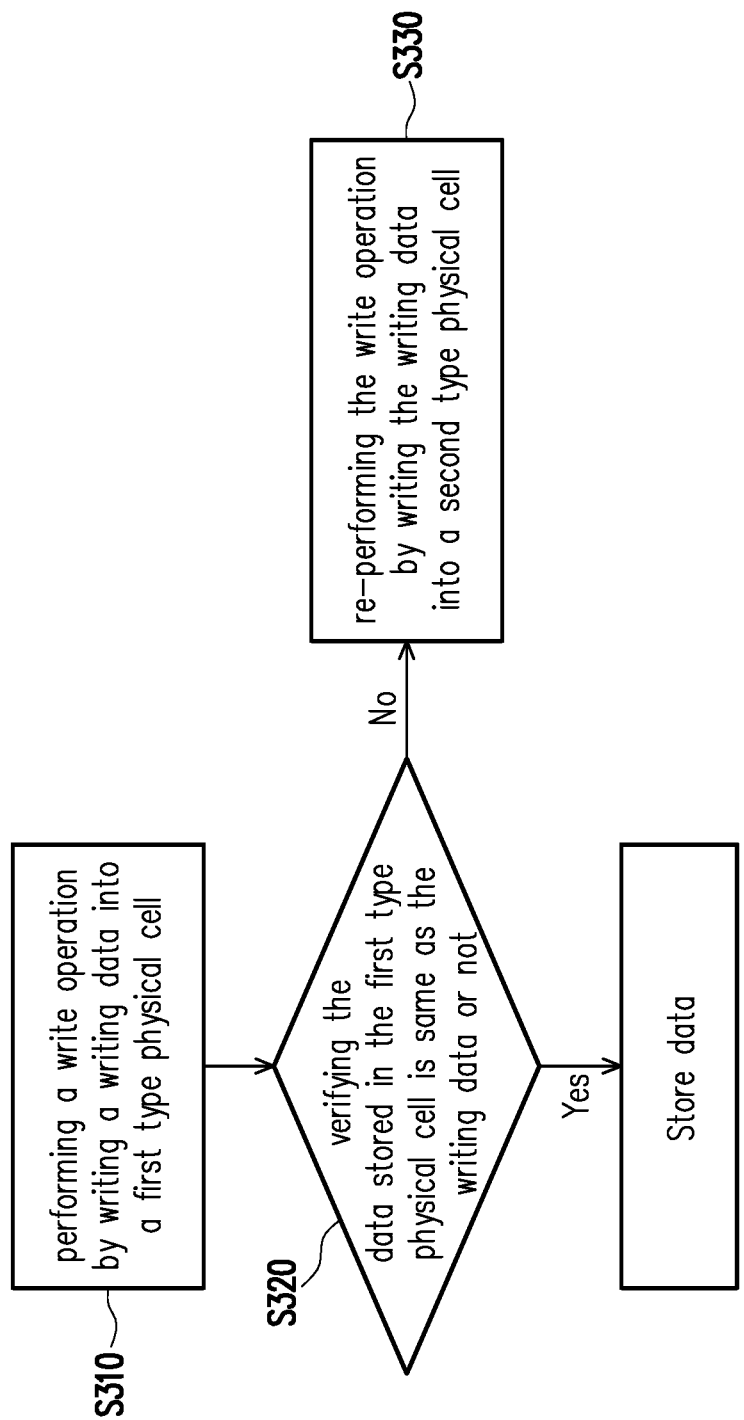
FIG. 3 illustrates a flow chart illustrating a method for multiple physical cells error correction in a memory cell according to an embodiment of the present disclosure.

Referring to FIG. 3, which illustrates a flow chart illustrating a multiple cell error correction method in a memory cell according to an embodiment of the disclosure. In step 310, performing a write operation by writing a writing data into a first type physical cell 111. The writing data is set and processed by an external device.

With reference to FIG. 1, the first type physical cell 111 is a used physical cell. The second type physical cell 112 is defined as unused physical cell, which are not used but used for a data repairing or used for backup the data. The first type physical cell 111 and the second type physical cell 112 are sub-divided into a message bit data 151 and a parity bit data 152.

The second type physical cell 112 is written to a same voltage level or a resistance value corresponding to a pre-set value.

The memory control circuit 120 writes the writing data into the first type physical cell 111.

After performing the write operation, verifying the data stored in the first type physical cell 111 is same as the writing data or not in step S320.

With reference to FIG. 1, the verification of the data stored in the first type physical cell 111 is performed by a summer circuit 128 to determine the data stored in the first type physical cell 111 is same as the writing data or not. In other words, the summer circuit 128 is configured to perform a verification operation in the first type physical cell 111 by verifying a cell current sum of the first type physical cell 111 and the second type physical cell 112.

After verification, if the verification of the data stored in the first type physical cell 111 is not same as the writing data in step S330, re-performing the write operation by writing the writing data into a second type physical cell 112 when the data stored in the first type physical cell 111 is not same as the writing data.

In some embodiments, in step S310 performing the write operation by writing the writing data into a first type physical cell 111. The data of the first type physical cell is a message bit data.

In some embodiments, in step S310 performing the write operation by writing the write data into a first type physical cell 111. The data of the first type physical cell is a parity bit data.

By using multiple physical cells error correction method, the data retention and the cycling endurance requirement of the message bits are different from the parity bits thus, the data reliability is enhanced.

Detail operations have been described in the embodiments mentioned above, no more repeated description here.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory device, comprising:
   a memory array, comprising a plurality of memory cells, wherein each of the memory cells comprises a first type physical cell and a second type physical cell that are located in each of the memory cells, wherein a type of the first type physical cell is different from a type of the second type physical cell; and
   a memory control circuit, coupled to each of the memory cells,
   wherein the memory control circuit writes a writing data into the first type physical cell of one of the plurality of memory cells, and verifies data stored in the first type physical cell of the one of the plurality of memory cells is same as the writing data or not, wherein the writing data is set and processed by performing a write operation, and the memory control circuit verifies the data stored in the first type physical cell is same as the writing data or not by verifying a cell current sum of the first type physical cell and the second type physical cell, and
   the memory control circuit writes the writing data into the second type physical cell of the one of the plurality of memory cells when the data stored in the first type physical cell of the one of the plurality of memory cells is not same as the writing data.

2. The memory device as claimed in claim 1, wherein the first type physical cell is a used physical cell and the second type physical cell is an un-used physical cell used as a data repairing.

3. The memory device as claimed in claim 1, wherein the data of the second type physical cell is set as a preset value.

4. The memory device as claimed in claim 3, wherein the data of the second type physical cell is initially written as bit "1".

5. The memory device as claimed in claim 3, wherein the data of the second type physical cell is initially written as bit "0".

6. The memory device as claimed in claim 1, wherein the writing data is a message bit data.

7. The memory device as claimed in claim 1, wherein the writing data is a parity bit data.

8. The memory device as claimed in claim 1, wherein the plurality of memory cells includes at least one message bit cell and at least one parity bit cell, and at least one parity bit cell use more number of physical cells than that of at least one message bit cell.

9. A method for multiple physical cells error correction in a memory array including a plurality of memory cells, the method comprising:
performing a write operation by writing a writing data into a first type physical cell that is located in one of the memory cells;
verifying the data stored in the first type physical cell is same as the writing data or not by performing a current sum verification on the first type physical cell and the second type physical cell; and
re-performing the write operation by writing the writing data into a second type physical cell that is located in the one of the memory cells when the data stored in the first type physical cell is not same as the writing data,
wherein the plurality of memory cells include at least one message bit cell and at least one parity bit cell, and the at least one parity bit cell use more number of physical cells than that of the at least one message bit cell.

10. The method as claimed in claim 9, wherein the first type physical cell is a used physical cell and the second type physical cell is an un-used physical cell used as a data repairing.

11. The method as claimed in claim 9, wherein the data of the second type physical cell is set as a preset value.

12. The method as claimed in claim 11, wherein the data of the second type physical cell is initially written as bit "1".

13. The method as claimed in claim 11, wherein the data of the second type physical cell is initially written as bit "0".

14. The method as claimed in claim 9, wherein the writing data is a message bit data.

15. The method as claimed in claim 9, wherein the writing data is a parity bit data.

16. A memory device, comprising:
a plurality of memory cells, wherein each of the memory cells comprises a first type physical cell and a second type physical cell that are located in each of the memory cells; and
a memory control circuit, coupled to each of the memory cells,
wherein the memory control circuit writes a writing data into the first type physical cell of one of the plurality of memory cells, and verifies data stored in the first type physical cell of the one of the plurality of memory cells is same as the writing data or not, wherein the writing data is set and processed by performing a write operation, and
writes the writing data into the second type physical cell of the one of the plurality of memory cells when the data stored in the first type physical cell of the one of the plurality of memory cells is not same as the writing data,
wherein the memory control circuit includes a summer circuit that calculates a sum of a first current sensed from the first type physical cell and a second current sensed from the second type physical cell,
wherein the memory control circuit verifies the data stored in the first type physical cell is same as the writing data or not according to the sum of the first current sensed from the first type physical cell and the second current sensed from the second type physical cell.

* * * * *